United States Patent [19]

Wilson et al.

[11] 4,142,231
[45] Feb. 27, 1979

[54] HIGH CURRENT LOW VOLTAGE LIQUID COOLED SWITCHING REGULATOR DC POWER SUPPLY

[75] Inventors: Edward A. Wilson; John R. Nowell, both of Phoenix, Ariz.

[73] Assignee: Honeywell Information Systems Inc., Phoenix, Ariz.

[21] Appl. No.: 868,097

[22] Filed: Jan. 3, 1978

[51] Int. Cl.² .......................................... H02M 3/315
[52] U.S. Cl. .................................................... 363/141
[58] Field of Search ...................... 363/141, 144, 146; 357/81

[56] References Cited

U.S. PATENT DOCUMENTS

| | | | |
|---|---|---|---|
| 3,289,068 | 11/1966 | Healis | 363/141 |
| 3,611,107 | 10/1971 | Ruckel | 363/144 |
| 4,015,184 | 3/1977 | Cooperman | 363/141 |

Primary Examiner—William M. Shoop
Attorney, Agent, or Firm—Edward W. Hughes; William W. Holloway, Jr.; Ronald T. Reiling

[57] ABSTRACT

An improved high current low voltage switching regulator power supply in which the major heat producing components of the power modules of the power supply are mounted on a pair of chill plates with a liquid cooled heat exchanger between the plates. The chill plates are electrically isolated from each other and the heat exchanger. One chill plate also serves as the positive power output bus and the other as the negative power output bus of the power supply which significantly reduces the parasitic inductance of the power supply.

8 Claims, 7 Drawing Figures

HIGH CURRENT LOW VOLTAGE LIQUID COOLED SWITCHING REGULATOR DC POWER SUPPLY

BACKGROUND OF THE INVENTION

1. Field of the Invention

This invention is in the field of switching regulator power supplies for producing regulated DC power at low voltages and large amperages, particularly such power supplies in which the major heat producing components are mounted on chill plates which are cooled by a liquid cooled heat exchanger and in which the chill plates are the output buses of the power supply.

2. Description of the Prior Art

Switching regulator power supplies for producing electric power at precisely regulated DC voltages and at high amperages are well known to the art. A typical example of such a power supply is described in U.S. Pat. No. 3,573,597 which issued on Apr. 6, 1971. It is also well known in the art to use a heat exchanger through which a liquid coolant is circulated to cool the mounting plates, heat sinks, or chill plates, on which the components of power supplies such as that described in the aforementioned U.S. Pat. No. 3,573,597 are mounted, particularly those which produce, or are the source of, the most heat. U.S. Pat. No. 4,009,423 which issued on Feb. 22, 1977, discloses a liquid cooled heat exchanger for cooling a pair of heat sinks, or chill plates, on which chill plates the components of the power supply that are the principal sources of heat are mounted. The chill plates of U.S. Pat. No. 4,009,423 are electrically connected together and can be used as one of the output buses of a power supply.

The power supplies of large solid state electronic systems such as large digital computers require regulated electrical power; i.e., electrical power at the proper voltages and amperages. In many such systems the voltages required are relatively low, 1.5 to 12 volts, while the magnitudes of the currents are large from 750 to 2,000 amperes, for example.

In designing power supplies it is desirable to maximize the ratio of watts of regulated power produced per unit volume of the power supply as well as the ratio of watts produced per dollar of cost of the power supply. One of the factors limiting these ratios is the maximum operating temperatures of the components of the power supply, particularly the junction temperatures of the silicon controlled rectifiers (SCR's) which are limited to around 100° C. to retain good high frequency characteristics. The junction temperatures of the power diodes are limited to a maximum of around 125° C. The use of liquid cooled heat exchangers for cooling chill plates on which the heat producing components of a switching regulator power supply are mounted has significantly increased the capability of dissipating heat produced by such components in order to maintain the maximum operating temperatures of such components at or below the maximum allowable values while keeping the volume of such power supplies to a minimum. However, additional attempts to significantly increase the ratio of watts per unit volume were impeded by the ratings of the components, particularly the maximum voltage ratings of the SCR's. In addition, in such large power supplies reducing the inductance in the secondary windings by reducing the number of turns of each secondary winding did not produce a proportionate increase in the current flow through them, a prerequisite to increasing the power output of a given power supply.

BRIEF SUMMARY OF THE INVENTION

Applicants have discovered that in large switching regulator power supplies in which the output voltage is in the range of from 1 to 5 volts, particularly those with high amperages in the range of from 750 amperes to 2,000 amperes, that increases in the power output of such power supplies was being limited by the parasitic inductance in the secondary circuits which was approaching that of the secondary windings, which parasitic inductance was due in large part to the inductance between the positive and negative power buses of the prior art power supplies. The inductance of the wires connecting the secondary coils of the reactors to the output buses was also contributing to the magnitude of the parasitic inductance. Another limiting factor was the need to maintain the junction temperature of the SCR's at a temperature of around 100° C. and to maintain the forward voltage across the SCR's below their maximum voltage rating of around 600 volts.

In prior art liquid cooled switching regulator power supplies, the SCR's are mounted on the top surface of the chill plates, but because of the high voltages applied across them they had to be electrically insulated from the chill plates. As a result, the thermal impedance between the SCR's and the heat exchanger is greater due to the presence of an additional layer of electrical insulation compared to the thermal impedance between the power diodes and the heat exchanger since the diodes are mounted directly on the chill plates. Thus, the thermal impedance between the power diodes which were directly mounted on the chill plates is less than that of the thermal path of the SCR's, notwithstanding that it was desirable to maintain the junction temperatures of the SCR's around 25° cooler than that of the power diodes. The close physical spacing between the SCR's and the chill plates on which they are mounted also created a small but finite capacitance between them which contributes to the magnitude of the electrical noise appearing on the output of such power supplies. A positive feedback relationship between the voltages induced across the parasitic inductance significantly increases the forward voltages across the SCR's and the commutation capacitors of the primary circuits of the power supply modules with the result that either the voltage ratings of these components have to be higher, which requires more costly components, or the power output must be reduced, either or both of which adversely affect the watts/dollar ratio and the watts/unit volume ratio.

The present invention solves the problems preventing a significant increase in the power output of liquid cooled switch regulator DC power supply by significantly reducing parasitic inductance of the power supply, particularly that between the positive and negative output buses to a minimum, and by providing a lower thermal impedance path between ths SCR's of such power supplies and the heat exchanger which also reduces the capacitive coupling between the SCR's and the output buses of the power supply.

Each power module of the power supply of this invention has a pair of reactors with each reactor having a primary and a secondary winding. An SCR is connected in series with the primary winding of each reactor and a power diode is connected in series with the secondary winding of each. The major heat producing components of the modules are mounted on a pair of chill plates which are cooled by a liquid cooled heat exchanger placed between the chill plates. The chill plates and the heat exchanger are held together by fastening means but each of the chill plates and the heat exchanger are electrically isolated, or insulated, from the other. The chill plates are also the input and output buses of the power supply which minimizes the parasitic inductance between them, reducing the magnitude of the parasitic inductance substantially compared to the magnitude of the parasitic inductance of prior art input-/output buses of such power supplies. The reactors are mounted on the perimeter of the chill plate and the wires which connect the secondary windings of the reactors to the output buses, where necessary, pass through openings through the chill plate on which the components are mounted in that portion of the chill plate which overhangs or extends beyond the edges of the heat exchanger so that the wires are essentially straight and thus as short as possible which further reduces the parasitic inductance of the power supply.

The SCR's of each module are directly mounted on a segment of a chill plate which is electrically isolated from the rest of the chill plate on which the components of the module are mounted which provides better cooling for the SCR's and reduces the capacitance between the SCR's and that portion of the chill plate on which the other heat producing components of the module are mounted which portion also serves as an output bus of the power supply.

It is therefore an object of this invention to provide an improved liquid cooled switching regulator DC power supply in which the parasitic inductance of the power supply is minimized.

It is another object of this invention to provide an improved switching regulator power supply having a pair of chill plates on which plates the components of the power supply are mounted with a liquid cooled heat exchanger between the chill plates, which chill plates are used as the output buses of the power supply.

It is still another object of this invention to provide a switching regulator power supply in which the cooling path for the SCR's of such power supplies has a low thermal impedance and in which the capacitance between the SCR's and the output buses of the power supplies is reduced.

It is still another object of this invention to provide an improved liquid cooled switching regulator DC power supply in which the ratios of watts produced per unit volume and the watts produced per dollar cost to produce the power supply are maximized.

BRIEF DESCRIPTION OF THE DRAWINGS

Other objects, features, and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
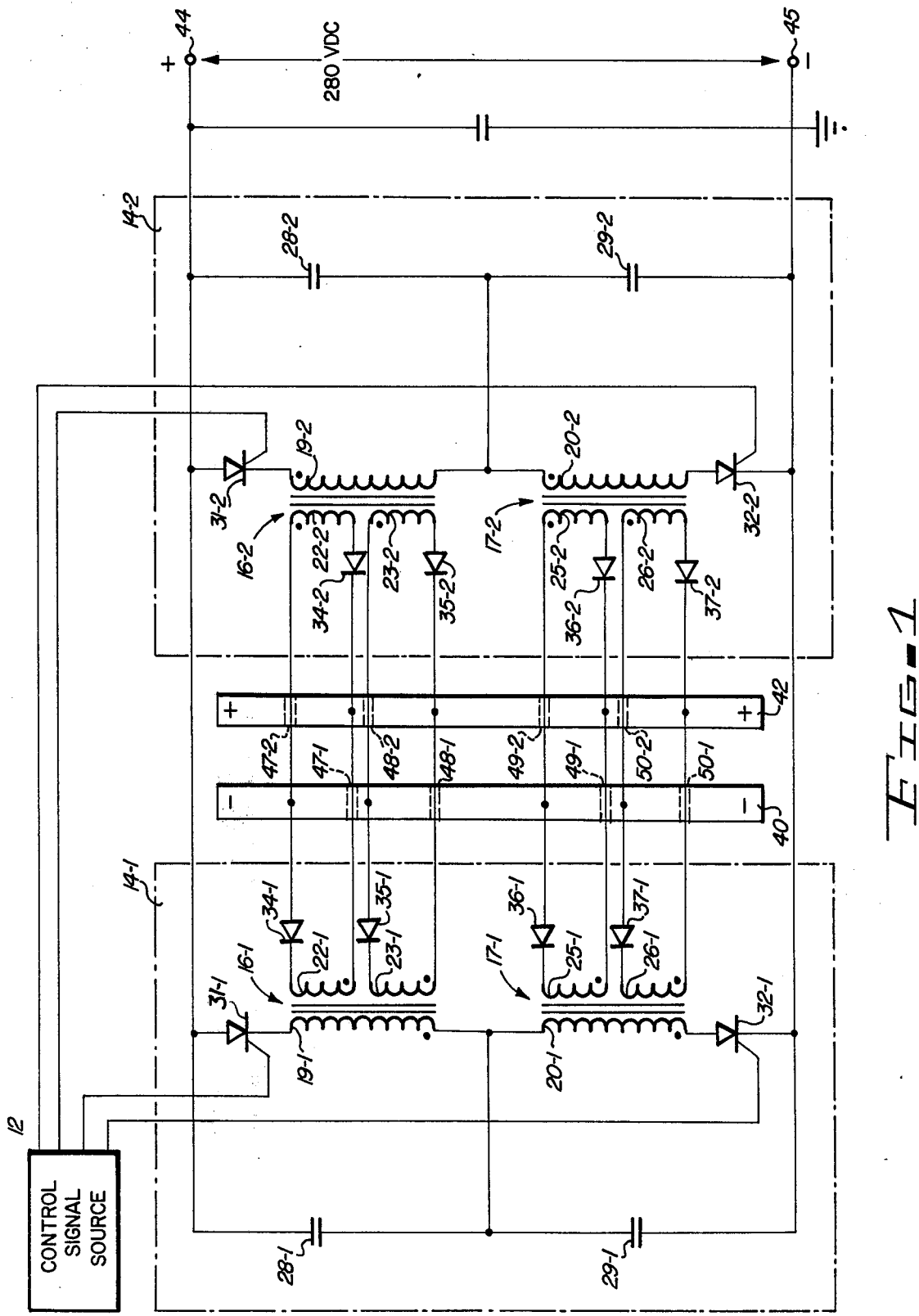
FIG. 1 is a schematic view of the electrical components of a pair of power modules and the manner of connecting the secondary windings of the reactors of such modules to the output buses of a switching regulator power supply.

In FIG. 1 the parts of a switching regulator DC power supply 10 relevant to understanding the invention are schematically illustrated. For details of the control signal source 12, the output filter portion of power supply 10, as well as a description of operation of switching regulator power supply 10, reference is made to U.S. Pat. No. 3,573,597 which issued on Apr. 6, 1971. In a preferred embodiment, power supply 10 has a plurality, eight of power modules 14, which modules are designated as 14-1 through 14-8. Only two power modules 14-1 and 14-2 are illustrated schematically in FIG. 1. All the other power modules 14 of power supply 10 are substantially identical to modules 14-1 and 14-2.

To minimize the number of reference numerals used in describing the preferred embodiment, the components of each power module identified such as reactors 16 and 17 will be given specific reference numerals. Where specific reference is made to the reactors 16, 17 of a given power module such as 14-2, the reactors of that power module will be identified as 16-2 and 17-2. In a similar manner, the components of each module will also be identified.

Each reactor 16 has a primary winding, or coil 19, and each reactor 17 has a primary winding 20. In the preferred embodiment each reactor 16 has a pair of secondary windings 22, 23 and each reactor 17 has a pair of secondary windings 25, 26. Each power module 14 is provided with a pair of commutating capacitors 28, 29 which are connected in series across an unregulated source of DC power. Discharge of the energy stored in the commutating capacitors 28, 29 through the primary windings 19, 20 of the reactors 16, 17 is controlled by SCR's, or current switches, 31 and 32 in response to control signals produced by control signal source 12 which are applied to the control gates of SCR's 31, 32. Power diodes, or current rectifiers, 34, 35, 36 and 37 are connected respectively in series with the secondary windings 22, 23, 25 and 26 of reactors 16, 17. As can be seen in FIG. 1, the anodes of the power diodes 34, 35, 36 and 37 are directly connected to the combined negative output bus and chill plate 40 and their cathodes are connected through the respective secondary windings to the combined positive output bus and chill plate 42. The number of secondary windings on each reactor is determined by the current carrying capacity of the power diode connected in series with each secondary winding. Input terminals 44, 45 are adapted to be connected to a conventional unregulated DC power source, which is not illustrated, but which in a preferred embodiment provides direct current at a voltage of substantially 280 volts.

Figure 2:
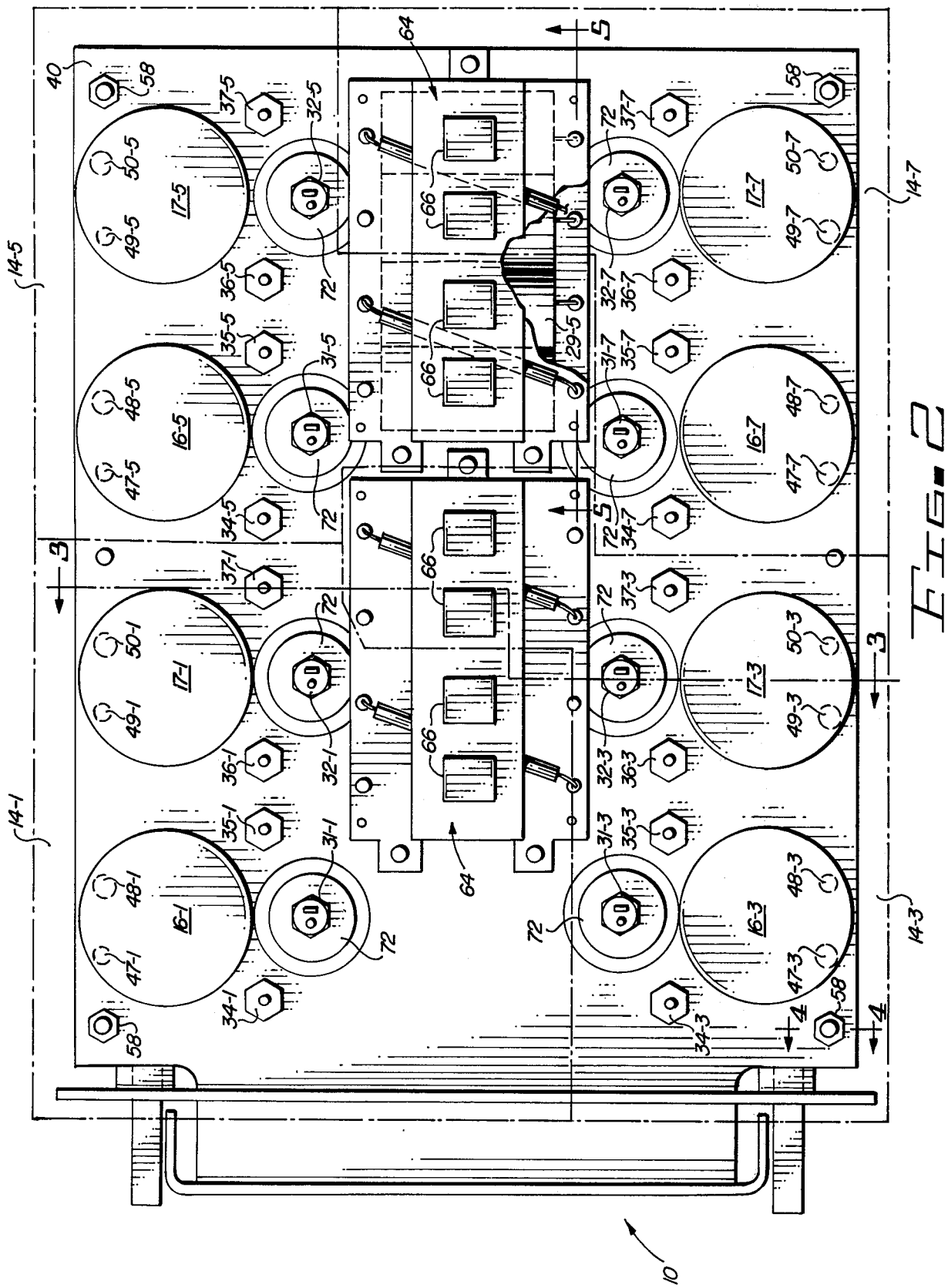
FIG. 2 is a side view of the improved switching regulator of the present invention.

In FIG. 2, the major heat producing components of power modules 14-1, 14-3, 14-5 and 14-7, or the odd numbered modules, namely, the reactors 16, 17 the SCR's 31, 32 and the power diodes 34, 35, 36 and 37, are illustrated as being mounted on chill plate 40. One of the terminals of each of the secondary windings 22, 23, 25 and 26 of power modules 14-1, 14-3, 14-5, 14-7, are connected to the positive output bus 42 which is not seen in FIG. 2. To minimize the parasitic inductance of the wires connecting the secondary windings to bus 42, openings 47, 48, 49 and 50 are formed in the chill plate on which the components of a given power module are mounted to minimize the length of these wires. Power diodes 34-1, 35-1, 36-1 and 37-1 are directly mounted on chill plate 40 which is also the negative output bus of power supply 10, and the anodes of diodes 34-1, 35-1, 36-1 and 37-1 are directly connected to their housings to minimize parasitic inductance.

Figure 3:
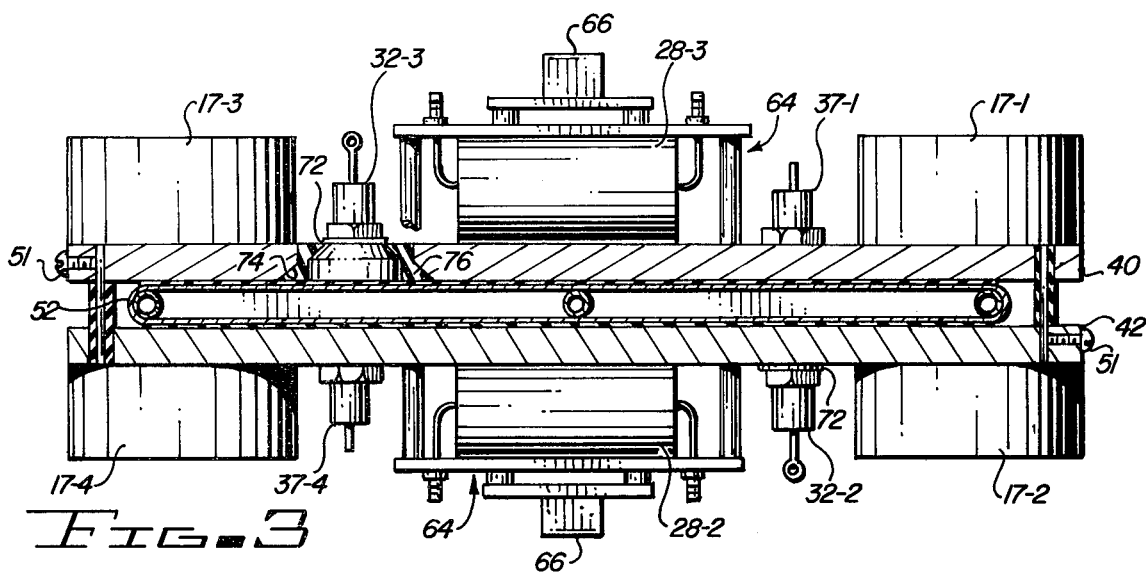
FIG. 3 is a sectional view taken on line 3—3 of FIG. 2.

Similarly, power diodes 34-2, 35-2, 36-2 and 37-2 are directly mounted on chill plate 42, the positive output bus of power supply 10 and the cathodes of diodes 34-2, 35-2, 36-2 and 37-2 are directly connected to their housings to again minimize parasitic inductance. The reactors 16, 17 of each of the odd numbered power modules which are mounted on chill plate 40, in the preferred example, are positioned on the periphery of plate 40 as seen in FIG. 2 so that the bores 47, 48, 49, 50 for the odd numbered modules are formed in the portion of plate 40 which overhangs, or extends beyond, the outer edges of heat exchanger 52 located between the chill plates 40 and 42 as seen in FIG. 3. The wires connecting the cathodes of the power diodes 34 through 37 of the odd numbered modules extending through openings 47, 48, 49, 50 of each power module through the secondary windings 22, 23, 25, 26 to chill plate 42 are electrically insulated to prevent any short circuits from occurring between these wires and chill plate 40. These wires are directly connected to chill plate 42 by a set screw 51, for example, as seen in FIG. 3.

Figures 4, 5:
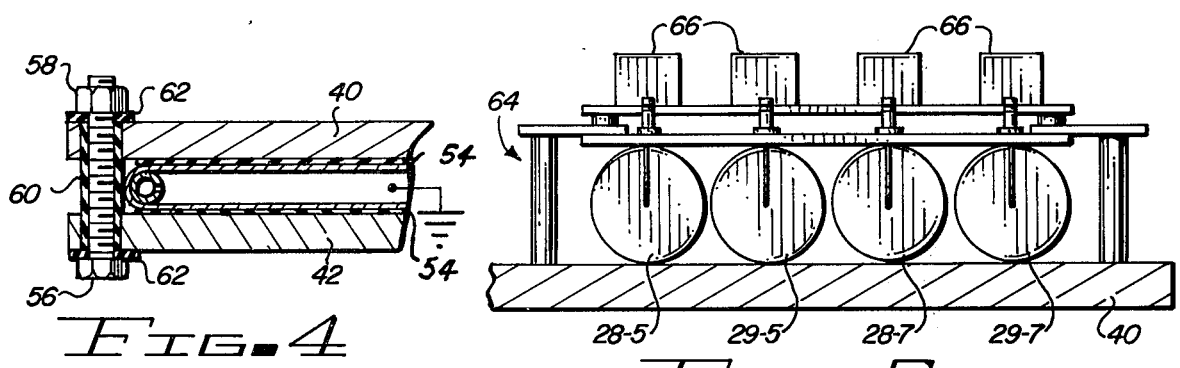
FIG. 4 is an enlarged sectional view taken on line 4—4 of FIG. 2.
FIG. 5 is a sectional view taken on line 5—5 of FIG. 2.

In FIG. 3 it can be seen that chill plates 40, 42 are positioned on either side of liquid cooled heat exchanger 52. Details of the construction and function of heat exchanger 52 are to be found in U.S. Pat. No. 4,009,423 which issued on Feb. 22, 1977. Mounted on chill plate 42, in the preferred embodiment, are the components of four even numbered power modules 14-2, 14-4, 14-6 and 14-8 with power module 14-2 being positioned substantially opposite to power module 14-1 as indicated schematically in FIG. 1. Thin layers of insulating material 54, Mylar 0.002 inches thick in a preferred embodiment, are placed between the thin flexible walls of heat exchanger 52 and the chill plates 40, 42 to electrically insulate heat exchanger 52 from output buses 40, 42. Chill plates, or buses, 40, 42 are bolted together with heat exchanger 52 clamped between them by conventional bolts 56 and nuts 58, one of which is shown in detail in FIG. 4. Each bolt 56 is surrounded by a cylinder 60 of insulating material and the heads of each bolt 56 and each nut 58 are electrically insulated from chill plates 40, 42 by insulating washer 62 as is illustrated in FIG. 4.

In FIG. 3 commutating capacitor 28-3 of power module 14-3 is seen. It is held in place by bracket 64. Mounted on the top of each bracket 64, two of which are seen in FIG. 2, are four pulse transformers 66 which are used to apply control, or firing pulses, to the gates of SCR's 31 and 32 of each power module 14 to cause the SCR's to conduct in response to control signals produced by source 12.

Figure 6:
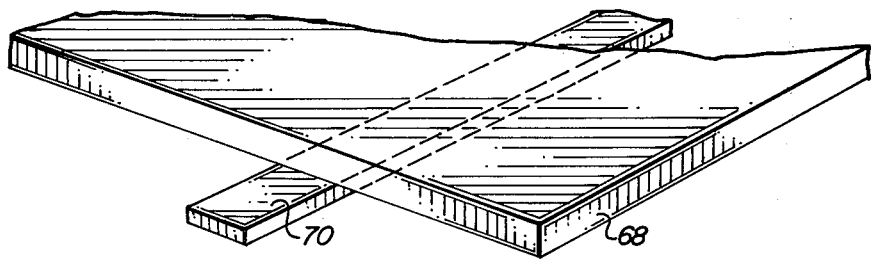
FIG. 6 illustrates schematically the prior art arrangement of the output buses of a switching regulator power supply.

Referring to FIG. 6, which illustrates schematically the arrangement of the output power buses of prior art switching current regulators, only one of two chill plates 68 is illustrated on which the components of the power modules of a switching regulator power supply would be mounted and which chill plate would preferably be cooled by a liquid cooled heat exchanger. Chill plate 68 of such a power supply would be used as one of the two output buses, positive or negative, of the power supply. A smaller bus 70 is spaced above chill plate 68 a distance of approximately 2 inches in order to clear the components mounted on plate 68, which are not illustrated.

Figure 7:
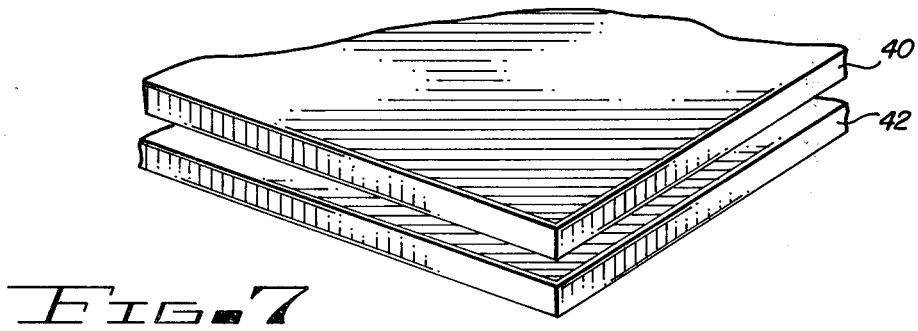
FIG. 7 illustrates schematically the arrangement of the output buses of this invention.

FIG. 7 shows schematically the relationship between the two chill plates 40, 42 of this invention which in the preferred embodiment are ½ inch thick plates of aluminum ten inches wide and which are spaced apart approximately ½ inch. Calculations have been made which show that the inductance between plates 40 and 42 is substantially ⅛th that of the prior art arrangement illustrated in FIG. 6.

In FIG. 1 it can be seen that the voltage applied across the SCR's 31, 32 and the primary windings of the reactors 16, 17 initially is equal to the voltage across terminals 44, 45, 280 volts DC in the preferred embodiment. The power output of switching regulator 10 is in the range of from 1 to 5 volts. Once power supply 10 is in operation the voltages across each commutating capacitor 28, 29 approach the magnitude of the supply voltage across terminals 44, 45. To the supply voltage is added a voltage due to the positive feedback of the voltages induced across the inductances in the secondary circuit, the inductances of the secondary windings and the parasitic inductances. As a result, the voltages across the commutating capacitors 28, 29 and the SCR's 31, 32 in the primary circuits of the reactors 16, 17 of each power module reach a maximum in the range of 450 to 550 volts DC which approaches the maximum voltage that an SCR can handle without adversely affecting the operation of power supply 10. A significant reduction in the parasitic inductance in the secondary circuits which is a substantial part of the total inductance of the secondary circuits reduces the maximum voltages in the primary circuits of the reactors of the power modules.

To adequately cool SCR's 31, 32 it is desirable that SCR's 31, 32 be mounted directly on the heat sink, or chill plate, so as to minimize the thermal impedance between each SCR 31, 32 and heat exchanger 52. Because of the high voltage applied to SCR's 31, 32 it is necessary that the SCR's be electrically insulated from the chill plate or output power bus in which it is mounted. To minimize the thermal impedance, each SCR 31, 32 is mounted on a segment 72 located in an opening 74 formed in a chill plate. Each segment 72 is electrically insulated from the balance of chill plates 40, 42 by a ring of insulating material 76, an epoxy compound, in a preferred embodiment, which also holds the segments 72 in place in openings 74 while providing the necessary electrical insulation. The spacing between each segment 72 and the adjoining output buses 40, 42 as well as the shape of the segments 72 and the openings 74 are optimized to reduce the capacitance between them. A reduction in the capacitance between each SCR and the adjacent output bus of substantially an order of magnitude is achieved by this arrangement compared with the prior art manner of mounting the SCR's on chill plates. Thus by using a separate segment 72 for each SCR 31, 32 each of which segment 72 is separated by an electrical insulating ring 76 from its associated chill plate 40 or 42 and from heat exchanger 52 only by insulating layer 54, a thermal path having a minimized thermal impedance between the SCR's 31, 32 and heat exchanger 52 is provided so that the SCR's can be operated at higher power levels while their maximum junction temperatures are prevented from exceeding the desired maximum of around 100° C.

As a result of the reduction in the parasitic inductance resulting from the use of the chill plates as the output buses of the power supply, the reduction of the parasitic inductance due to the shortened leads between the output windings of the reactors and the output buses, the parasitic inductance of the power supply is significantly reduced which reduces the amount of energy stored in the electromagnetic field of said inductances and also reduces the voltage which builds up across the commutating capacitor and the SCR's in the primary circuits of the reactors of the power modules so that the maximum voltages across the SCR's, for example, are below their limits and substantially lower than would be the case if a higher parasitic inductance was present, other parameters remaining the same. In addition, the decrease in parasitic inductance particularly between the output buses 40, 42 results in a corresponding increase in the capacitance between the output buses which has the advantageous effect of reducing the magnitudes of variations in the voltage between the two buses and thus makes the filtering of the output voltage of the power supply to obtain a precisely regulated DC output voltage easier to accomplish with smaller components.

The improvements in efficiency in a switching regulator power supply in which the chill plates are used to cool the components and to serve as the output buses of the power supply are significant. The parasitic inductance of the power supply is further reduced by the reduction in the length of the wires connecting the secondary windings of the reactors to the output buses. Cooling of the SCR's in the primary circuits is enhanced by providing separate segments of the chill plate which are insulated from the plate and on which the SCR's are mounted, which arrangement reduces the capacitance between the SCR's and the output buses substantially by an order of magnitude which reduces the capacitive coupling between the primary and secondary circuits. As a result, a more efficient power supply is produced, one in which the ratio of watts per unit volume is substantially increased approaching a value of substantially 150% of comparable prior art switching regulator power supplies with a significant reduction in the ratio of watts/dollar for such a power supply.

What is claimed is:

1. In a liquid cooled switching regulator power supply having at least one power module, said module having a pair of reactors, each reactor having a primary winding and a secondary winding, a pair of current switches for controlling current flow through the primary windings of the reactors, current rectifying means having an anode and a cathode connected in series with the secondary winding of the reactor to rectify current flow through said secondary winding, a first and a second chill plate, a liquid cooled heat exchanger for cooling the chill plates, means for fastening the chill plates and heat exchanger together so that the heat exchanger can cool the chill plates, the improvements comprising:

means for electrically insulating the chill plates from each other;

the reactors, current switches and current rectifying means of the power module being mounted on the first chill plate;

the anodes of the current rectifying means of the power module being connected to the first chill plate and the cathodes of the current rectifying means being connected to the second chill plate through the secondary winding of the reactor, whereby the first chill plate is the negative power bus and the second chill plate is the positive power bus of the power supply.

2. In a power supply as defined in claim 1 in which the first chill plate is provided with a segment electrically insulated from the rest of the first chill plate, and a current switch of the power module is directly mounted on each segment.

3. In a power supply as defined in claim 2 in which the cathodes of the current rectifying means of the power module are connected to the second chill plate through openings formed in the first chill plate.

4. In a liquid cooled switching regulator power supply having 2 "n" power modules where "n" is a positive integer, each module having a pair of reactors, each reactor having a primary winding and a secondary winding, a pair of SCR's for controlling current flow through the primary windings of the reactors, power diodes connected in series with the secondary windings of the reactors to rectify current flow through said secondary windings, a first and a second chill plate, a liquid cooled heat exchanger for cooling the chill plates, means for fastening the chill plates and heat exchanger together so that the heat exchanger can cool the chill plates, the improvements comprising:

means for electrically insulating the chill plates from each other;

the reactors, SCR's and power diodes of the odd numbered power modules being mounted on the first chill plate;

the reactors, SCR's and power diodes of the even numbered modules being mounted on the second chill plate, the anodes of the power diodes of the power modules being connected to the first chill plate and the cathodes of the power diodes being connected to the second chill plate, whereby the first chill plate is the negative power output bus and the second chill plate is the positive power output bus of the power supply.

5. In a power supply as defined in claim 4 in which the chill plates are provided with segments electrically insulated from the rest of the chill plate, and one SCR is directly mounted on each segment.

6. In a power supply as defined in claim 5 in which the cathodes of the diodes of the odd numbered power modules are connected to the second chill plate through an opening formed in the first chill plate and the anodes of the diodes of the even numbered power modules are connected to the first chill plate through openings formed in the second chill plate.

7. In a power supply as defined in claim 6 in which "n" equals one.

8. In a power supply as defined in claim 6 in which "n" equals four.

* * * * *